United States Patent [19]
Dale et al.

[11] Patent Number: 5,696,988
[45] Date of Patent: Dec. 9, 1997

[54] CURRENT/VOLTAGE CONFIGURABLE I/O MODULE HAVING TWO D/A CONVERTERS SERIALLY COUPLED TOGETHER SUCH THAT DATA STREAM FLOWS THROUGH THE FIRST D/A TO THE SECOND D/A

[75] Inventors: Cory L. Dale, Fishersville, Va.; Russell S. Gantman, Cary; Kevin M. Hackenbruch, High Point, both of N.C.

[73] Assignee: GE FANUC Automation North America, Inc., Charlottesville, Va.

[21] Appl. No.: 538,958

[22] Filed: Oct. 4, 1995

[51] Int. Cl.⁶ ............................................ G06F 13/12
[52] U.S. Cl. .................. 395/821; 395/824; 341/144; 341/139
[58] Field of Search .................. 340/347; 341/145, 341/139, 144; 364/900; 360/31; 324/248; 395/821, 824

[56] References Cited

U.S. PATENT DOCUMENTS

| | | | |
|---|---|---|---|
| 4,430,642 | 2/1984 | Weigand et al. | 340/347 |
| 4,503,421 | 3/1985 | Hareyama et al. | 340/347 |
| 4,799,112 | 1/1989 | Bremmer et al. | 360/31 |
| 4,821,125 | 4/1989 | Christenson et al. | 360/31 |
| 4,843,392 | 6/1989 | Gulczynski | 341/145 |
| 4,918,647 | 4/1990 | Downey | 364/900 |
| 4,998,108 | 3/1991 | Ginthner et al. | 341/145 |
| 5,047,876 | 9/1991 | Genheimer et al. | 360/46 |
| 5,107,378 | 4/1992 | Cronch et al. | 360/45 |
| 5,262,907 | 11/1993 | Duffy et al. | 360/77.05 |
| 5,270,715 | 12/1993 | Kano | 341/139 |
| 5,532,592 | 7/1996 | Colclough | 324/248 |

*Primary Examiner*—Thomas C. Lee
*Assistant Examiner*—David Ton
*Attorney, Agent, or Firm*—James H. Beusse

[57] ABSTRACT

A current/voltage configurable I/O module is provided for a programmable logic controller. The I/O module includes first and second D/A converters which are cascaded together such that a data stream provided to the first D/A converter flows through to the second D/A converter. Each of the D/A converters includes a respective current output, a voltage output and range/mode select inputs. A serial to parallel shift register is coupled between a microprocessor data output and the data input of the first D/A converter such that information from a data stream supplied by the microprocessor is passed in serial fashion to the first and second D/A converters. The shift register also includes parallel outputs, namely range/mode select outputs, to which range/mode select information from the data stream is provided. The range/mode select outputs of the shift register are coupled to the range/mode select inputs of the first and second D/A converters such that the range/mode select information can instruct the first and second D/A converters with respect to a current/voltage mode and a current/voltage range to employ. In this manner, the range and mode of the I/O module can be readily configured and reconfigured as desired.

10 Claims, 5 Drawing Sheets

FIG. 1B
(PRIOR ART)

| INPUTS | | | OPERATION |
|---|---|---|---|
| CLEAR | RANGE SELECT 2 | RANGE SELECT 1 | |
| 0 | X | X | NORMAL OPERATION |
| 1 | X | X | OUTPUT AT BOTTOM OF SPAN |
| X | 0 | 0 | 0V - 5V RANGE |
| X | 0 | 1 | 4-20 mA RANGE |

FIG. 3

| RANGE SELECT INPUTS | | | | SELECTED MODE AND RANGE |
|---|---|---|---|---|
| CHANNEL 1 (CH1) | | CHANNEL 2 (CH2) | | |
| DAC 110 RANGE SELECT2 (RS2) | DAC 110 RANGE SELECT1 (RS1) | DAC 115 RANGE SELECT2 (RS2) | DAC 115 RANGE SELECT1 (RS1) | |
| 0 | 0 | 0 | 0 | CH1 VOLTAGE OUT*; CH2 VOLTAGE OUT* |
| 0 | 0 | 0 | 1 | CH1 VOLTAGE OUT*; CH2 4-20mA OUT |
| 0 | 0 | 1 | 0 | CH1 VOLTAGE OUT*; CH2 (NOT VALID) |
| 0 | 0 | 1 | 1 | CH1 VOLTAGE OUT*; CH2 0-20mA OUT |
| 0 | 1 | 0 | 0 | CH1 4-20mA OUT; CH2 VOLTAGE OUT* |
| 0 | 1 | 0 | 1 | CH1 4-20mA OUT; CH2 4-20mA OUT |
| 0 | 1 | 1 | 0 | CH1 4-20mA OUT; CH2 (NOT VALID) |
| 0 | 1 | 1 | 1 | CH1 4-20mA OUT; CH2 0-20mA OUT |
| 1 | 0 | 0 | 0 | CH1 (NOT VALID); CH2 VOLTAGE OUT* |
| 1 | 0 | 0 | 1 | CH1 (NOT VALID); CH2 4-20mA OUT |
| 1 | 0 | 1 | 0 | CH1 (NOT VALID); CH2 (NOT VALID) |
| 1 | 0 | 1 | 1 | CH1 (NOT VALID); CH2 0-20mA OUT |
| 1 | 1 | 0 | 0 | CH1 0-20 mA OUT; CH2 VOLTAGE OUT* |
| 1 | 1 | 0 | 1 | CH1 0-20 mA OUT; CH2 4-20mA OUT |
| 1 | 1 | 1 | 0 | CH1 0-20 mA OUT; CH2 (NOT VALID) |
| 1 | 1 | 1 | 1 | CH1 0-20 mA OUT; CH2 0-20mA OUT |

\* - ACTUAL VOLTAGE RANGE (0-10 V OR -10V TO +10V) DEPENDENT ON ACTUAL MAGNITUDE OF DATA SENT TO DAC

CURRENT/VOLTAGE CONFIGURABLE I/O MODULE HAVING TWO D/A CONVERTERS SERIALLY COUPLED TOGETHER SUCH THAT DATA STREAM FLOWS THROUGH THE FIRST D/A TO THE SECOND D/A

BACKGROUND OF THE INVENTION

This invention relates in general to programmable logic controllers and, more particularly, to input/output (I/O) modules used in programmable logic controllers. Programmable logic controllers (PLC's) are a relatively recent development in process control technology. As a part of process control, a PLC is used to monitor input signals from a variety of input points (input sensors) which report events and conditions occurring in a controlled process. For example, a PLC can monitor such input conditions as motor speed, temperature, pressure, volumetric flow and the like. A control program is stored in a memory within the PLC to instruct the PLC what actions to take upon encountering particular input signals or conditions. In response to these input signals provided by input sensors, the PLC derives and generates output signals which are transmitted via PLC output points to various output devices to control the process. For example, the PLC issues output signals to speed up or slow down a conveyer, rotate the arm of a robot, open or close a relay, raise or lower temperature as well as many other possible control functions too numerous to list.

The input and output points referred to above are typically associated with input modules and output modules, respectively. Those skilled in the art alternatively refer to such I/O modules as I/O cards or I/O boards. These I/O modules are typically pluggable into respective slots located on a backplane board in the PLC. The slots are coupled together by a main bus which couples any I/O modules plugged into the slots to a central processing unit (CPU). The CPU itself can be located on a card which is pluggable into a dedicated slot on the backplane of the PLC.

Conventional I/O modules include I/O modules with analog input and I/O modules with analog output. I/O modules with fixed voltage ranges are known. Moreover, I/O modules with fixed current ranges are known.

I/O modules can employ a digital to analog converter (DAC or D/A converter) to convert the digital signals from the PLC CPU to analog output signals useful for driving controlled devices coupled to the output points of such I/O modules. One such digital to analog converter is the Model AD420 serial input 16-bit DAC manufactured by Analog Devices, Norwood, Mass. and which is depicted in the block diagram of FIG. 1A as DAC 10. DAC 10 includes a DATA IN input, a CLOCK input, a CLEAR input and a DATA OUT output. DAC 10 also includes an analog current output $I_{OUT}$ and an analog voltage output $V_{OUT}$. Range select inputs RANGE SELECT 1 and RANGE SELECT 2 are provided on DAC 10 to permit selection of desired current output ranges and selection of a voltage output range. More particularly, the truth table of FIG. 1B depicts the resultant current range selection and voltage range selection for particular values of RANGE SELECT 1, RANGE SELECT 2 and CLEAR. It is noted that the application notes of DAC 10 show the RANGE SELECT 1 and RANGE SELECT 2 inputs as being "hard tied". In other words, during DAC operation these inputs are tied to fixed, non-varying voltages or logic levels. Consequently, during DAC operation the selection of a particular current range or voltage range remains non-changing. Such DAC devices as DAC 10 were intended to operate in a design employing one preselected and nonchanging mode. More flexibility in the operation of I/O modules employing DAC's is very desirable.

SUMMARY OF THE INVENTION

Accordingly, one object of the present invention is to provide an I/O module with configurable current and voltage ranges.

Another object of the present invention is to provide an I/O module with current and voltage ranges which are configurable on a per channel basis and which includes I/O capability in a single module so as to occupy merely a single slot on a PLC backplane.

Yet another object of the present invention is to provide an I/O module with a selectable mode (current or voltage output) and range on a per channel basis.

In accordance with one embodiment of the present invention, an I/O module is provided for use with a programmable logic controller. The I/O module includes a first digital to analog converter having a data input and a data output. The first digital to analog converter further includes a current output, a voltage output and range/mode select inputs. The I/O module also includes a second digital to analog converter having a data input and a data output. The second digital to analog converter further includes a current output, a voltage output and range/mode select inputs. The data input of the second digital to analog converter is coupled to the data output of the first digital to analog converter. The I/O module also includes a serial to parallel shift register having a data input and a data output. The data output of the shift register is coupled to the data input of the first digital to analog converter. The shift register includes first range/mode select outputs coupled to the range/mode select inputs of the first digital to analog converter. The shift register further includes second range/mode select outputs coupled to the range/mode select inputs of the second digital to analog converter. The I/O module also includes a microprocessor for providing a serial data stream to the data input of the shift register such that data from the serial data stream is provided to the first range/mode select outputs and the second range/mode select outputs of the shift register to instruct the first and second digital to analog converters with respect to a mode to select and a range to select. In one embodiment, the mode is a current output mode or a voltage output mode and the range is a current range or a voltage range.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIG. 1B is a truth table for the digital to analog converter of FIG. 1A.

FIG. 2 is a block diagram of a voltage/current range configurable I/O module in accordance with one embodiment of the present invent/on.

FIG. 3 is a truth table showing possible range select values and corresponding I/O module modes and ranges.

DETAILED DESCRIPTION OF THE INVENTION

Figure 1A:
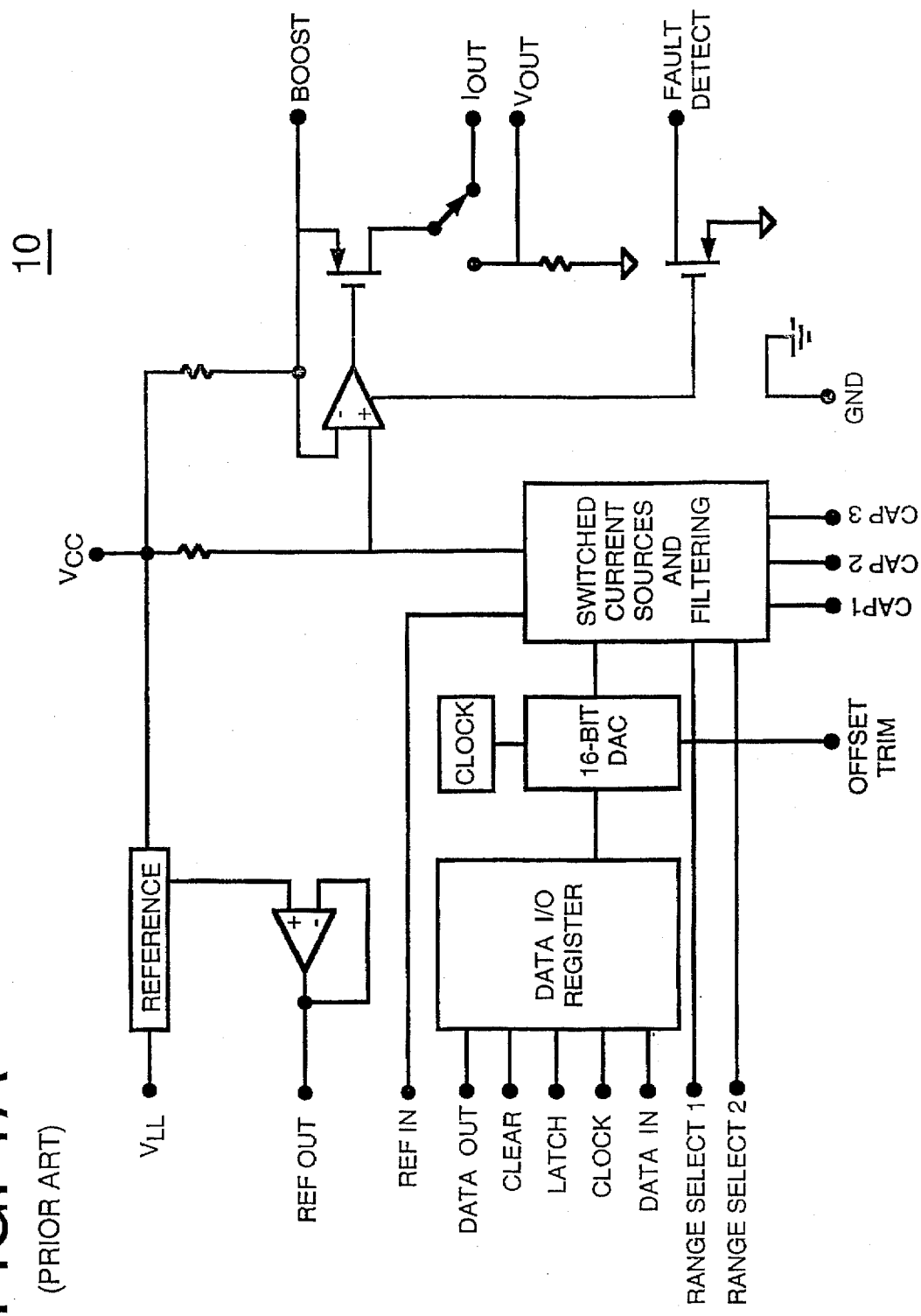
FIG. 1A is a block diagram of a conventional digital to analog converter 10.
Figure 2:
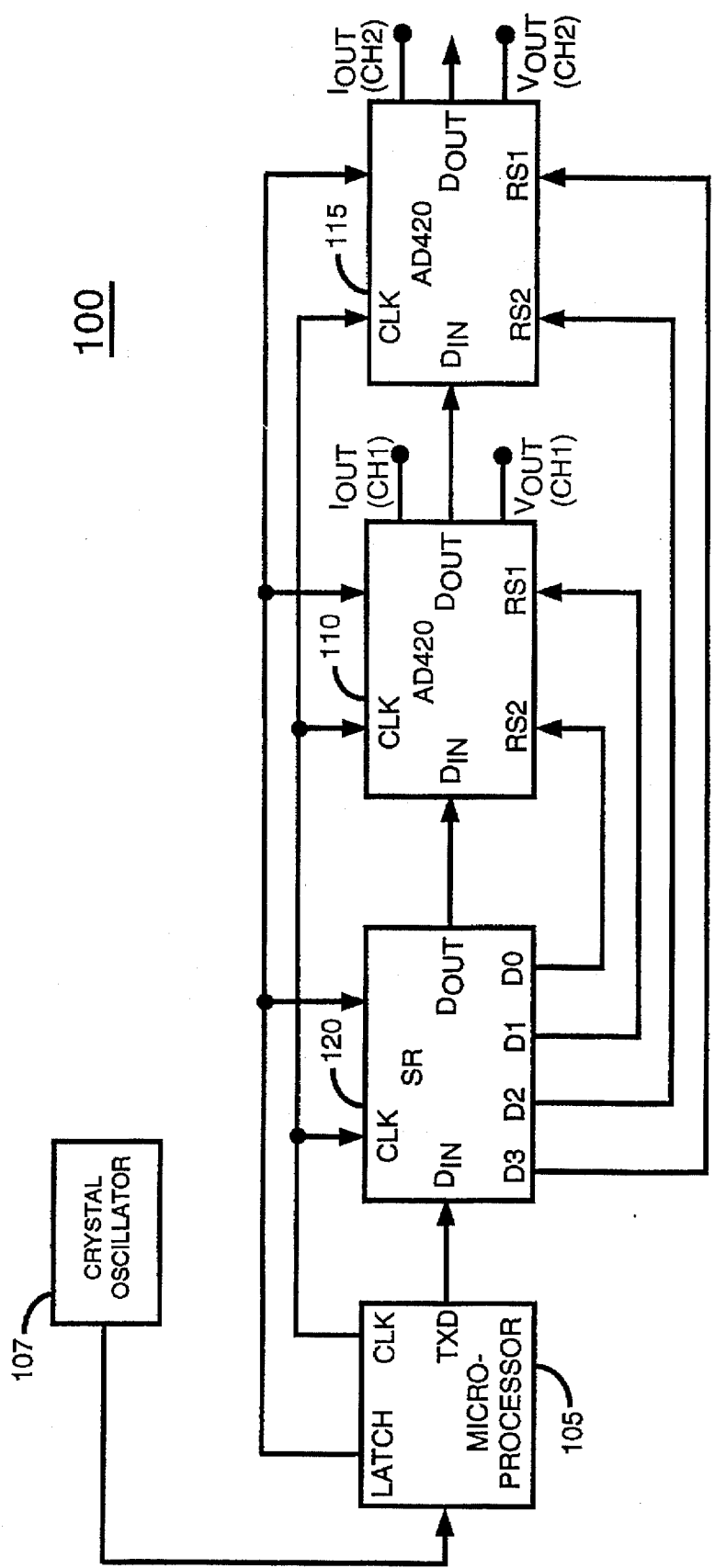

FIG. 2 shows a block diagram of a voltage/current range configurable I/O module in accordance with one embodiment of the present invention as I/O module 100. I/O module 100 includes a microprocessor 105 which is coupled to the backplane of a PLC (backplane and PLC not shown). In this manner, I/O module 100 receives instructions and data from the PLC. Microprocessor 105 includes a LATCH output and a clock input (CLK) as shown. The clock input (CLK) of microprocessor 105 is coupled to a clock circuit 107 which provides a time base to microprocessor 105. Microprocessor 105 provides system clock (CLK) signals to other components of I/O module 100. Microprocessor 105 further includes a TXD output at which the microprocessor provides a data output stream.

I/O module 100 includes a digital to analog converter DAC 110 which is cascaded with another DAC 115. Each DAC is defined to be a channel. In this manner, multiple channels are coupled in serial fashion in which data out of the previous channel is provided as data in to the next channel. More particularly, the $D_{OUT}$ output of DAC 110 is coupled to the $D_{IN}$ input of DAC 115. One digital to analog converter which can be employed as DAC's 110 and 115 is the earlier discussed Analog Devices Model AD420 DAC.

A serial-to-parallel shift register 120 (SR) is coupled between the TXD output of microprocessor 105 and the $D_{IN}$ input of DAC 110. More particularly, the TXD output of microprocessor 105 is coupled to the serial $D_{IN}$ input of shift register 120 and the serial $D_{OUT}$ output of shift register 120 is coupled to the $D_{IN}$ input of DAC 110. Shift register 120 further includes parallel outputs D0, D1, D2 and D3 which are respectively coupled to the range select input RS2 of DAC 110, range select input RS1 of DAC 110, range select input RS2 of DAC 115 and range select input RS1 of DAC 115. This serial-to-parallel shift register provides for selection of the output mode (voltage or current) exhibited by I/O module 100 and further provides for selection of a particular voltage range or current range once the mode is selected. The D0, D1, D2 and D3 parallel outputs are alternatively referred to as mode/range select outputs.

A serial data stream originating from microprocessor 105 and containing 16 bits of output magnitude data per channel is clocked through the chain formed by serial-to-parallel shift register 120, DAC 110 and DAC 115. Each block of 16 bits of data is latched into its corresponding output channel's DAC. Shift register 120 forms part of this chain of cascaded DAC's which are being loaded with data. In this manner, additional bits can be added to the serial data stream to be latched into shift register 120 so as to drive the range select inputs (RS1, RS2) of DAC's 110 and 115. This permits configuration software which is later described in more detail to set and change the output mode (current or voltage) and range. Shift register 120 provides mode/range select bits from microprocessor 105 via outputs D0, D1, D2 and D3 to the range select inputs (RS1, RS2) of DAC's 110 and 115. These range select bits can be changed under direction of the configuration software to select a desired mode and range. While the term "range select bits" is used herein, it is understood that the particular values selected for the range select bits RS1 and RS2 of DAC's 110 and 115 not only determine the ranges selected for I/O module 100 but also the modes (current or voltage) selected for I/O module 100. Thus, range select inputs RS2 and RS1 of DAC's 110 and 115 are also referred to as "range/mode select" inputs.

FIG. 3 is a truth table showing the possible combination of the four range select values, namely RS1 and RS2 of DAC 110 and RS1 and RS2 of DAC 115 and the resultant mode and ranges which are selected to configure the I/O module.

Figure 4:
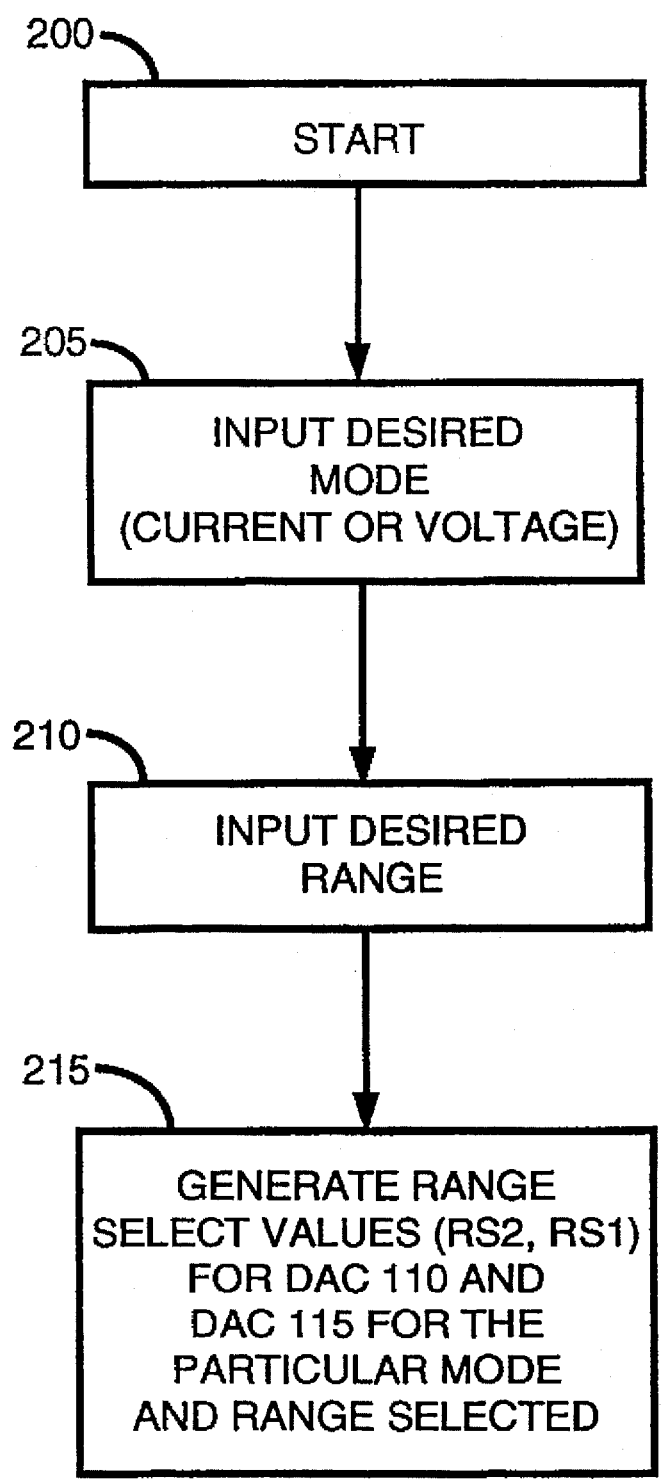
FIG. 4 is a flow chart showing the process flow of configuration software which is used to set and change the mode and range associated with the I/O module.

FIG. 4 is a flow chart of the configuration software which enables the user to program a particular I/O module 100 with the appropriate range select bits. Process flow begins at start block 200 and continues to block 205 at which the user inputs the desired mode (current output or voltage output). Process flow then continues to block 210 at which the user inputs the desired range (for example, 0 to 20 mA or −10 V to +10 V). This mode and range information can be provided to microprocessor 105 by a hand-held input device or other data input terminal coupled to microprocessor 105. Using the mode and range information, microprocessor 105 generates the corresponding values for RS2 and RS1 of DAC's 110 and 115 as per the truth table of FIG. 3 and provides these values to the data stream at microprocessor output TXD. These RS2, RS1 values appear at the D3, D2, D1 and D0 parallel outputs of shift register 120 which provides these values to respective RS2, RS1 inputs of DAC's 110 and 115 as indicated in FIG. 2. In response, DAC's 110 and 115 assume the selected mode and range which corresponds to these RS2, RS1 values. Since the channels can be configured on a per channel basis, the user can also mix or match output modes and ranges and reconfigure the I/O module as often as desired.

The foregoing has described an I/O module for a programmable logic controller wherein the I/O module can be configured and reconfigured to different modes and operating ranges as desired by the user. The I/O module is advantageously implemented in a single module so as to occupy merely a single slot on a PLC backplane.

While only certain preferred features of the invention have been shown by way of illustration, many modifications and changes will occur to those skilled in the art. It is, therefore, to be understood that the present claims are intended to cover all such modifications and changes which fall within the true spirit of the invention.

What is claimed is:

1. An I/O module for a programmable logic controller comprising:

a first digital to analog converter including a data input and a data output, the first digital to analog converter further including a current output, a voltage output and range/mode select inputs;

a second digital to analog converter including a data input and a data output, the second digital to analog converter further including a current output, a voltage output and range/mode select inputs, the data input of the second digital to analog converter being serially coupled to the data output of the first digital to analog converter;

a serial to parallel shift register including a serial data input and a serial data output, the serial data output of the shift register being serially coupled to the data input of the first digital to analog converter, the shift register including first parallel range/mode select outputs coupled to the range/mode select inputs of the first digital to analog converter, the shift register further including second parallel range/mode select outputs coupled to the range/mode select inputs of the second digital to analog converter, such that a current output mode is individually selectable for one of the first and second digital to analog converters while a voltage output mode is individually selectable for the other of the first and second digital to analog converters; and a microprocessor for providing a serial data stream to the serial data input of the shift register such that data from the serial data stream is provided to the first parallel range/mode select outputs and the second parallel range/mode select outputs of the shift register to instruct the first and second digital to analog converters with respect to a mode to select and a range to select.

2. The I/O module of claim 1 wherein the mode of the first digital to analog converter is a current output mode and the mode of the second digital to analog converter is a voltage output mode, the range of the first digital to analog converter being a current range, the range of the second digital to analog converter being a voltage range.

3. The I/O module of claim 1 wherein the mode of the first digital to analog converter is a voltage output mode and the mode of the second digital to analog converter is a current output mode, the range of the first digital to analog converter being a voltage range, the range of the second digital to analog converter being a current range.

4. The I/O module of claim 1 wherein the mode of the first digital to analog converter is a current output mode and the mode of the second digital to analog converter is a current output mode, the range of the first digital to analog converter being a current range, the range of the second digital to analog converter being a current range.

5. The I/O module of claim 1 wherein the mode of the first digital to analog converter is a voltage output mode and the mode of the second digital to analog converter is a voltage output mode, the range of the first digital to analog converter being a voltage range, the range of the second digital to analog converter being a voltage range.

6. An I/O module for a programmable logic controller comprising:

a microprocessor including a data output at which a serial data stream including first information and range/mode select information is produced;

a serial to parallel shift register coupled to the data output of the microprocessor, the shift register serially passing the first information to a serial data output of the shift register, the shift register providing the range/mode select information to parallel range/mode select outputs of the shift register;

a first D/A converter including a data input coupled to the serial data output of the shift register to receive first information therefrom, the first D/A converter including a current output, a voltage output and range/mode select inputs;

a second D/A converter coupled in serial cascade arrangement with the first D/A converter to receive first information serially from the first D/A converter, the second D/A converter including a current output, a voltage output and range/mode select inputs; and coupling means for coupling the parallel range/mode select outputs of the shift register to the range/mode select inputs of the first and second D/A converters such that range/mode select information from the data stream instructs the first and second D/A converters with respect to a mode to select and a range to select, so that a current output mode is individually selectable for one of the first and second D/A converters while a voltage output mode is individually selectable for the other of the first and second D/A converters.

7. The I/O module of claim 6 wherein the mode of the first D/A converter is a current output mode and the mode of the second D/A converter is a voltage output mode, the range of the first D/A converter being a current range, the range of the second D/A converter being a voltage range.

8. The I/O module of claim 6 wherein the mode of the first D/A converter is a voltage output mode and the mode of the second D/A converter is a current output mode, the range of the first D/A converter being a voltage range, the range of the second D/A converter being a current range.

9. The I/O module of claim 6 wherein the mode of the first D/A converter is a current output mode and the mode of the second D/A converter is a current output mode, the range of the first D/A g converter being a current range, the range of the second D/A converter being a current range.

10. The I/O module of claim 6 wherein the mode of the first D/A converter is a voltage output mode and the mode of the second D/A converter is a voltage output mode, the range of the first D/A converter being a voltage range, the range of the second D/A converter being a voltage range.

* * * * *